(12) United States Patent
Choi et al.

(10) Patent No.: US 10,662,313 B2
(45) Date of Patent: May 26, 2020

(54) ORGANIC ELECTRONIC ELEMENT AND METHOD FOR MANUFACTURING SAME

(71) Applicant: LG CHEM, LTD., Seoul (KR)

(72) Inventors: Doowhan Choi, Daejeon (KR); Jaesoon Bae, Daejeon (KR); Jiyoung Lee, Daejeon (KR); Jaechol Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 16/304,004

(22) PCT Filed: Mar. 29, 2017

(86) PCT No.: PCT/KR2017/003410
§ 371 (c)(1),
(2) Date: Nov. 21, 2018

(87) PCT Pub. No.: WO2017/209384
PCT Pub. Date: Dec. 7, 2017

(65) Prior Publication Data
US 2019/0203016 A1    Jul. 4, 2019

(30) Foreign Application Priority Data

Jun. 3, 2016  (KR) .................. 10-2016-0069834

(51) Int. Cl.
*C08K 5/14* (2006.01)
*C08K 5/16* (2006.01)
(Continued)

(52) U.S. Cl.
CPC ............. *C08K 5/14* (2013.01); *C08K 5/16* (2013.01); *C08L 33/02* (2013.01); *C08L 79/02* (2013.01); *C08L 79/08* (2013.01); *H01L 51/00* (2013.01); *H01L 51/004* (2013.01); *H01L 51/42* (2013.01); *H01L 51/4246* (2013.01); *H01L 51/4273* (2013.01); *Y02E 10/549* (2013.01); *Y02P 70/521* (2015.11)

(58) Field of Classification Search
CPC . C08G 75/32; C08G 2261/91; H01L 51/0047; Y02E 10/549
USPC .......... 428/690; 528/377, 378, 380; 252/301.16; 564/426; 549/41, 456, 160, 549/349, 331; 136/263
See application file for complete search history.

(56) References Cited

U.S. PATENT DOCUMENTS

| | | |
|---|---|---|
| 5,331,183 A | 7/1994 | Sariciftci et al. |
| 5,454,880 A | 10/1995 | Sariciftci et al. |

(Continued)

FOREIGN PATENT DOCUMENTS

| | | |
|---|---|---|
| JP | 2010116563 | 5/2010 |
| KR | 1020040017761 | 2/2004 |

(Continued)

OTHER PUBLICATIONS

International Search Report with English Language Translation of the International Searching Authority corresponding to International Patent Application No. PCT/KR2017/003410 dated Jul. 26, 2017. (6 pages).

(Continued)

*Primary Examiner* — Shane Fang
(74) *Attorney, Agent, or Firm* — Myers Bigel, P.A.

(57) ABSTRACT

The present specification relates to an organic electronic device and a method for manufacturing the same.

20 Claims, 3 Drawing Sheets

(51) Int. Cl.
*C08L 33/02* (2006.01)
*C08L 79/02* (2006.01)
*C08L 79/08* (2006.01)
*H01L 51/00* (2006.01)
*H01L 51/42* (2006.01)

(56) References Cited

U.S. PATENT DOCUMENTS

| | | |
|---|---|---|
| 9,214,255 B2 | 12/2015 | Lee et al. |
| 2004/0038839 A1 | 2/2004 | Kim et al. |
| 2010/0117522 A1 | 5/2010 | Park et al. |
| 2014/0216551 A1 | 8/2014 | Park et al. |
| 2015/0107674 A1 | 4/2015 | Lee et al. |
| 2015/0179965 A1 | 6/2015 | Lee et al. |
| 2016/0035979 A1 | 2/2016 | Lee et al. |

FOREIGN PATENT DOCUMENTS

| | | |
|---|---|---|
| KR | 101121165 | 2/2012 |
| KR | 1020130133571 | 12/2013 |
| KR | 1020140101041 | 8/2014 |
| KR | 1020150074704 | 7/2015 |
| KR | 1020150121407 | 10/2015 |
| KR | 1020150125618 | 11/2015 |
| KR | 1020160018008 | 2/2016 |
| KR | 1020160067340 | 6/2016 |
| WO | 2016/120721 | 8/2016 |

OTHER PUBLICATIONS

Gu et al. "Influences of surface capping with electrostatically self-assembled PEI on the photoresponse of a TiO2 thin film" Chemical Communications, 20143 (3 pages).

Haas et al, Oxidized Polyethylenimine, Journal of Polymer Science: Polymer Chemistry Edition, vol. 10, 1972, pp. 3143-3158.

Supplementary European Search Report corresponding to European Application No. EP17806877, dated Apr. 15, 2019, 9 pages.

PEI → M-PEI

ORGANIC ELECTRONIC ELEMENT AND METHOD FOR MANUFACTURING SAME

CROSS REFERENCE TO RELATED APPLICATIONS

This application is a 35 U.S.C. § 371 national stage application of PCT International Application No. PCT/KR2017/003410, filed on Mar. 29, 2017, which claims priority from Korean Patent Application No. 10-2016-0069834, filed on Jun. 3, 2016, the contents of which are incorporated herein by reference in their entireties. The above reference PCT International Application was published in the Korean language as International Publication No. WO 2017/209384 A1 on Dec. 7, 2017.

Technical Field

The present specification relates to an organic electronic device and a method for manufacturing the same.

BACKGROUND ART

In the present specification, an organic electronic device is an electronic device using an organic semiconductor material, and requires hole and/or electron exchanges between an electrode and the organic semiconductor material. An organic electronic device may be categorized into two main groups depending on an operation principle. First is an electronic device in which excitons form in an organic material layer by the photons brought into the device from an external light source, these excitons are separated into electrons and holes, and these electrons and holes are used as a current source (voltage source) by each of these being transferred to different electrodes. Second is an electronic device in which holes and/or electrons are injected to an organic semiconductor material layer that forms an interface with an electrode by applying a voltage or a current to two or more electrodes, and the device is operated by the injected electrons and holes.

Examples of an organic electronic device include an organic solar cell, an organic light emitting device, an organic photo conductor (OPC), an organic transistor and the like, and these all need an electron/hole injection material, an electron/hole extraction material, an electron/hole transfer material or a light emitting material for the driving of the device. Hereinafter, an organic solar cell will be described in detail mostly, however, in the organic electronic devices described above, the electron/hole injection material, the electron/hole extraction material, the electron/hole transfer material or the light emitting material is all used under similar principles.

A solar cell is a battery changing electric energy directly from sunlight, and studies thereon have been actively progressed since it is a clean alternative energy source for resolving fossil energy depletion and global environmental problems caused by the use thereof. Herein, the solar cell means a battery producing current-voltage using a photovoltaic effect producing electrons and holes by absorbing light energy from sunlight.

A solar cell is a device capable of directly converting solar energy to electric energy by applying a photovoltaic effect. Solar cells are divided into inorganic solar cells and organic solar cells depending on the materials forming a thin film.

Numerous researches have been ongoing for increasing power conversion efficiency through changes in various layers and electrodes obtained by solar cell designs.

PRIOR ART DOCUMENTS

Patent Documents (Patent Document 1) U.S. Pat. No. 5,331,183
(Patent Document 2) U.S. Pat. No. 5,454,880

DISCLOSURE

Technical Problem

The present specification is directed to providing an organic electronic device and a method for manufacturing the same.

Technical Solution

One embodiment of the present specification provides an organic electronic device including a cathode; an anode disposed opposite to the cathode; an organic active layer disposed between the cathode and the anode; and an electron transfer layer disposed between the cathode and the organic active layer, wherein the electron transfer layer includes an oxidized non-conjugated polymer electrolyte.

Another embodiment of the present specification provides an organic electronic device including a cathode; an anode disposed opposite to the cathode; an organic active layer disposed between the cathode and the anode; an electron transfer layer disposed between the cathode and the organic active layer; and a coating layer disposed between the organic active layer and the electron transfer layer, wherein the coating layer includes an oxidized non-conjugated polymer electrolyte.

Still another embodiment of the present specification provides a method for manufacturing an organic electronic device including preparing a substrate; forming a cathode on the substrate; forming an electron transfer layer on the cathode; forming an organic active layer on the electron transfer layer; and forming an anode on the organic active layer, wherein the electron transfer layer includes an oxidized non-conjugated polymer electrolyte.

Yet another embodiment of the present specification provides a method for manufacturing an organic electronic device including preparing a substrate; forming a cathode on the substrate; forming an electron transfer layer on the cathode; forming a coating layer on the electron transfer layer; forming an organic active layer on the coating layer; and forming an anode on the organic active layer, wherein the coating layer includes an oxidized non-conjugated polymer electrolyte.

Advantageous Effects

An organic electronic device according to one embodiment of the present specification can use an organic active layer of various materials. In addition, a highly efficient organic electronic device can be provided.

In addition, an organic electronic device according to one embodiment of the present specification is capable of providing an organic electronic device having an excellent lifespan.

REFERENCE NUMERAL

101: Substrate
201: Cathode
301: Anode
401: Electron Transfer Layer
501: Coating Layer
601: Photoactive Layer
701: Hole Transfer Layer

MODE FOR DISCLOSURE

Hereinafter, the present specification will be described in more detail.

In the present specification, a description of a certain member being placed "on" another member includes not only a case of the certain member adjoining the another member but a case of still another member being present between the two members.

In the present specification, a description of a certain part "including" certain constituents means capable of further including other constituents, and does not exclude other constituents unless particularly stated on the contrary.

One embodiment of the present specification provides an organic electronic device including a cathode; an anode disposed opposite to the cathode; an organic active layer disposed between the cathode and the anode; and an electron transfer layer disposed between the cathode and the organic active layer, wherein the electron transfer layer includes an oxidized non-conjugated polymer electrolyte.

Another embodiment of the present specification provides an organic electronic device including a cathode; an anode disposed opposite to the cathode; an organic active layer disposed between the cathode and the anode; an electron transfer layer disposed between the cathode and the organic active layer; and a coating layer disposed between the organic active layer and the electron transfer layer, wherein the coating layer includes an oxidized non-conjugated polymer electrolyte.

The organic electronic device of the present disclosure may be manufactured using common organic electronic device manufacturing methods and materials except that an oxidized non-conjugated polymer electrolyte is included in the electron transfer layer or the coating layer.

In addition, the organic active layer of the present disclosure may be a photoactive layer or a light emitting layer.

Hereinafter, an organic solar cell will be illustrated.

One embodiment of the present specification provides an organic solar cell including a cathode; an anode disposed opposite to the cathode; a photoactive layer disposed between the cathode and the anode; and an electron transfer layer disposed between the cathode and the photoactive layer, wherein the electron transfer layer includes an oxidized non-conjugated polymer electrolyte.

Another embodiment of the present specification provides an organic solar cell including a cathode; an anode disposed opposite to the cathode; a photoactive layer disposed between the cathode and the anode; an electron transfer layer disposed between the cathode and the photoactive layer; and a coating layer disposed between the photoactive layer and the electron transfer layer, wherein the coating layer includes an oxidized non-conjugated polymer electrolyte.

In the present specification, the non-conjugated polymer electrolyte means a polymer that does not include a conjugated group and including an electrolyte group as a repeating unit, and means a salt separated into anions and cations in an aqueous solution and thereby having charges.

In one embodiment of the present specification, the oxidized non-conjugated polymer electrolyte is oxidized using a peroxide-based oxidizer.

According to one embodiment of the present specification, the peroxide-based oxidizer may be an organic peroxide.

According to one embodiment of the present specification, the peroxide-based oxidizer may be hydrogen peroxide ($H_2O_2$).

When using hydrogen peroxide as the oxidizer, water remains as a reactant after oxidation, which may not affect non-conjugated polymer electrolyte properties.

In the present specification, "oxidation" means that cations are formed while electrons fall off in a non-conjugated polymer electrolyte, and these cations bind to anions of oxygen. For example, "oxidation" means reacting hydrogen peroxide with a non-conjugated polymer electrolyte including an amine group ($-NR_2$, R is hydrogen or a monovalent organic group) and modifying the non-conjugated polymer electrolyte to include an ionic group of $-N^+R_2O^-$.

In one embodiment of the present specification, the oxidized non-conjugated polymer electrolyte includes at least one of $-NR_2^+O^-$ and $-COOH^+O^-$, and R is hydrogen; or a monovalent organic group.

In one embodiment of the present specification, the oxidized non-conjugated polymer electrolyte includes at least one of hydroxylamine, nitrone, oxazirane and N-oxide.

In one embodiment of the present specification, a preoxidized material of the oxidized non-conjugated polymer electrolyte includes at least one of $-NR_2$ and $-COOH$, and R is hydrogen; or a monovalent organic group.

In the present specification, the monovalent organic group means a functional group that is not hydrogen, includes a halogen group; a nitro group; a cyano group; a carboxyl group; a hydroxyl group; a carbonyl group; a sulfo group; an alkyl group; an allyl group; an alkoxy group; a cycloalkyl group; an alkenyl group; an ester group; an ether group; a sulfoxy group; an arylalkyl group; an aryl group; a heterocyclic group and the like, and may be unsubstituted or substituted with additional substituents, however, the monovalent organic group is not limited thereto.

In one embodiment of the present specification, as the non-conjugated polymer electrolyte, one, two or more are selected from the group consisting of polyethyleneimine (PEI); polyethyleneimine ethoxylate (PEIE); and polyacrylic acid (PAA).

In one embodiment of the present specification, a preoxidized material of the oxidized non-conjugated polymer electrolyte, which is a non-conjugated polymer electrolyte oxidized to form the oxidized non-conjugated polymer electrolyte, has a weight average molecular weight of 6,000 g/mol to 1,000,000 g/mol. In this case, a thin layer may be readily formed in manufacturing an organic solar cell.

According to one embodiment of the present specification, the electron transfer layer including the oxidized non-conjugated polymer electrolyte is disposed adjoining a cathode. In this case, the oxidized non-conjugated polymer electrolyte forms a thin layer of a few nanometer and changes work function of the cathode by a dipole moment.

According to one embodiment of the present specification, the coating layer is disposed adjoining an electron transfer layer. In this case, electrons may readily migrate by lowering work function of the electron transfer layer and thereby being in electrical ohm contact with a photoactive layer.

The organic solar cell including an electron transfer layer or a coating layer including an oxidized non-conjugated polymer electrolyte according to one embodiment of the present specification may use an electron donor material that has not been used when including a non-conjugated polymer electrolyte that is not oxidized in the art, and high efficiency of the organic solar cell may be expected since those skilled in the art readily control materials of the organic solar cell as necessary.

In existing organic solar cells, a non-conjugated polymer electrolyte (non-conjugated polyelectrolyte, NPE) has been used as an electron transfer layer. The non-conjugated polymer electrolyte is a non-conductor, and needs to form an ultra-thin layer of 1 nm to 2 nm to change work function of a cathode without disturbing a current flow. However, an organic solar cell is difficult to be reproduced with a coating method other than a spin coater in order to form an ultra-thin layer leading to a problem of being uneconomical in terms of time and/or costs required for forming an ultra-thin layer.

In addition, when including an electron transfer layer or a coating layer including the oxidized non-conjugated polymer electrolyte, a dipole property formed from oxidation is obtained and work function of a cathode may be changed without disturbing a current flow even at a thickness of ultra-thin layer or greater, which is advantageous economically and in terms of costs. In addition, there is an advantage in that coating may be carried out in a relatively wide range due to a conductivity increase.

In addition, ultraviolet light is a factor inhibiting a lifespan of a photoactive layer in an organic solar cell, and since the oxidized non-conjugated polymer electrolyte according to one embodiment of the present specification absorbs ultraviolet light, there is a favorable effect on a lifespan of the organic solar cell.

Figure 3:
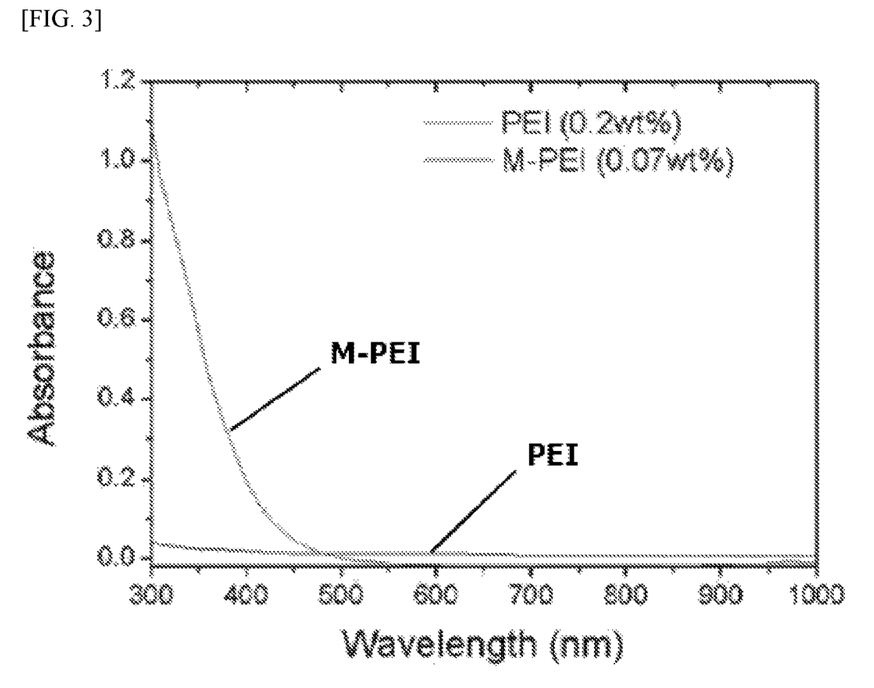
FIG. 3 is an example comparing absorption spectra of polyethyleneimine (PEI) and oxidized polyethyleneimine (M-PEI).

FIG. 3 is an example comparing absorption spectra of a non-conjugated polymer electrolyte and an oxidized non-conjugated polymer electrolyte. Based on the results of FIG. 3, it is identified that an oxidized non-conjugated polymer electrolyte absorbs ultraviolet light and thereby is advantageous in terms of a photoactive layer lifespan.

Figure 2:
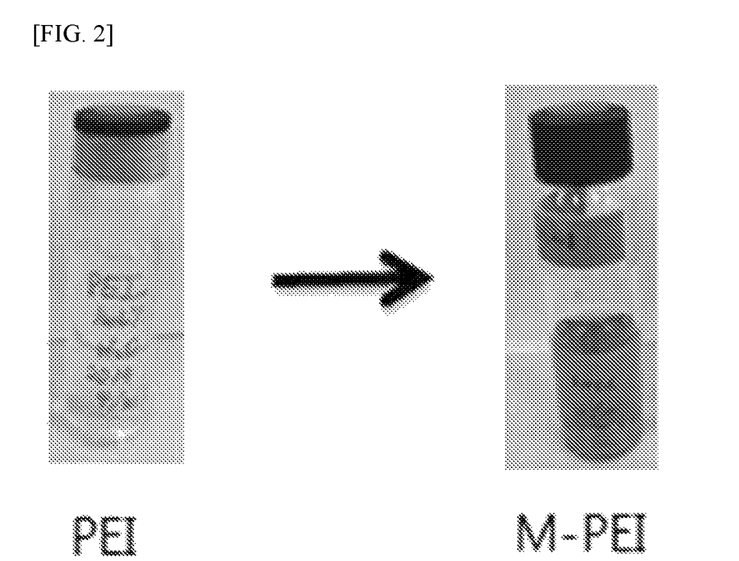
FIG. 2 is a diagram showing an observation of color changes in polyethyleneimine (PEI) and oxidized polyethyleneimine (M-PEI).

FIG. 2 is a diagram showing an observation of color changes in a non-conjugated polymer electrolyte and an oxidized non-conjugated polymer electrolyte.

As shown in FIGS. 2, 3, 5 and 6, before and after oxidation may be compared by color changes, absorption spectra and NMR analyses, and the like.

The organic electronic device according to one embodiment of the present specification includes an electron transfer layer or a coating layer including an oxidized non-conjugated polymer electrolyte, and therefore, may control a thickness as necessary, and as a result, high efficiency of an organic electronic device may be induced.

In one embodiment of the present specification, the electron transfer layer or the coating layer including an oxidized non-conjugated polymer electrolyte has a thickness of greater than or equal to 1 nm and less than or equal to 15 nm instead of having an ultra-thin layer thickness.

By the organic electronic device according to one embodiment of the present specification including an organic material layer including an oxidized non-conjugated polymer electrolyte, more various thicknesses may be used compared to existing thicknesses while maintaining efficiency.

In one embodiment of the present specification, the organic electronic device has an inverted structure. The inverted structure may mean forming a cathode on a substrate. Specifically, according to one embodiment of the present specification, an electrode formed on a substrate may be a cathode when the organic electronic device has an inverted structure.

Figure 1:
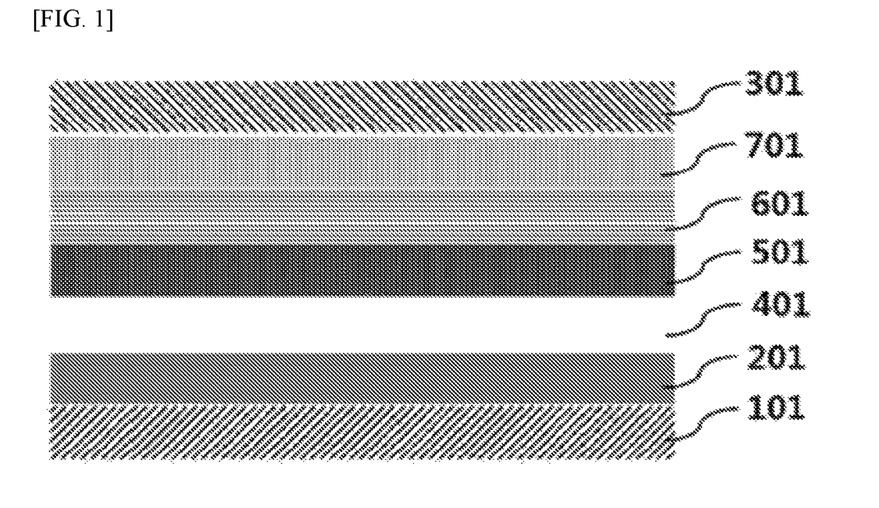
FIG. 1 illustrates an organic solar cell according to one embodiment.

FIG. 1 illustrates an organic solar cell according to one embodiment.

Specifically, FIG. 1 includes a substrate (101), a cathode (201), an electron transfer layer (401), a coating layer (501), a photoactive layer (601), a hole transfer layer (701) and an anode (301).

FIG. 1 is an illustrative structure according to an embodiment of the present specification, and may further include other organic material layers.

The organic electronic device having an inverted structure of the present specification may mean that an anode and a cathode of an organic electronic device having a general structure are formed in a reverse direction. An Al layer used in an organic electronic device having a general structure is very vulnerable to an oxidation reaction in the air and is difficult to be inked, and commercializing the same through a printing process has limits. However, the organic electronic device having a reverse direction structure of the present specification may use Ag instead of Al, and therefore, is stable to an oxidation reaction compared to an organic electronic device having a general structure, and is advantageous in commercialization through a printing process since an Ag ink is readily prepared.

In the present specification, the substrate may be a glass substrate or a transparent plastic substrate having excellent transparency, surface smoothness, handling easiness and water resistance, but is not limited thereto, and substrates commonly used in organic electronic devices may be used without limit. Specifically, glass, polyethylene terephthalate (PET), polyethylene naphthalate (PEN), polypropylene (PP), polyimide (PI), triacetyl cellulose (TAC) and the like may be included, however, the substrate is not limited thereto.

In the present specification, the cathode may be a transparent conductive oxide layer or a metal electrode. When the electrode of the present specification is a transparent conductive oxide layer, those doping a material having conductivity on, in addition to glass and a quartz plate, a flexible and transparent material such as plastic including polyethylene terephthalate (PET), polyethylene naphthalate (PEN), polypropylene (PP), polyimide (PI), polycarbonate (PC), polystyrene (PS), polyoxymethylene (POM), an acrylonitrile styrene (AS) resin, an acrylonitrile butadiene styrene (ABS) resin, triacetyl cellulose (TAC), polyarylate (PAR) and the like may be used as the electrode. Specifically, indium tin oxide (ITO), fluorine doped tin oxide (FTO), aluminum doped zinc oxide (AZO), indium zinc oxide (IZO), ZnO—$Ga_2O_3$, ZnO—$Al_2O_3$ and antimony tin oxide (ATO) and the like may be included, and more specifically, ITO may be included.

In addition, the anode may be a metal electrode in the present specification. Specifically, the metal electrode may include one, two or more types selected from the group consisting of silver (Ag), aluminum (Al), platinum (Pt), tungsten (W), copper (Cu), molybdenum (Mo), gold (Au), nickel (Ni) and palladium (Pd). More specifically, the metal electrode may be silver (Ag).

The electron transfer layer material may include electron-extracting metal oxides, and may specifically include metal complexes of 8-hydroxyquinoline; complexes including $Alq_3$; metal complexes including Liq; LiF; Ca; titanium oxide ($TiO_x$); zinc oxide (ZnO); and cesium carbonate ($Cs_2CO_3$) and the like, but is not limited thereto.

In one embodiment of the present specification, the cathode is a first electrode, and the anode is a second electrode.

In one embodiment of the present specification, the anode is a first electrode, and the cathode is a second electrode.

In one embodiment of the present specification, the organic active layer includes an electron donor material and an electron acceptor material. In the present specification, the electron donor material and the electron acceptor material may mean an organic active material.

In the present specification, a ratio of the electron donor material and the electron acceptor material in the organic active layer may be controlled by those in the art as necessary.

In one embodiment of the present specification, the organic active layer may be a photoactive layer.

In the photoactive layer, the electron donor material forms electron and hole-paired excitons by photoexcitation, and the excitons are separated into electrons and holes at an electron donor/electron acceptor interface. The separated electrons and holes each migrate to the electron donor material and the electron acceptor material, respectively, and these may be collected in a cathode and an anode, respectively, to be used as electric energy externally.

In addition, in one embodiment of the present specification, the photoactive layer may have a bulk heterojunction structure or a double layer junction structure. The bulk heterojunction structure may be a bulk heterojunction (BHJ) type, and the double layer junction structure may be a bi-layer junction type.

According to one embodiment of the present specification, the electron donor material may include at least one type of electron donor; or a polymer of at least one type of electron acceptor and at least one type of electron donor. The electron donor material includes at least one type of electron donor. In addition, the electron donor material includes a polymer of at least one type of electron acceptor and at least one type of electron donor.

Specifically, the electron donor material may include various polymer materials and monomer materials such as, starting from poly[2-methoxy-5-(2'-ethyl-hexyloxy)-1,4-phenylene vinylene] (MEH-PPV), thiophene-based, fluorene-based or carbazole-based.

Specifically, the monomer material may include one or more types of materials selected from the group consisting of copper(II) phthalocyanine, zinc phthalocyanine, tris[4-(5-dicyanomethylidenemethyl-2-thienyl)phenyl]amine, 2,4-bis[4-(N,N-dibenzylamino)-2,6-dihydroxyphenyl]squaraine, benz[b]anthracene and pentacene.

Specifically, the polymer material may include one or more types of materials selected from the group consisting of poly-3-hexylthiophene (P3HT), poly[N-9'-heptadecanyl-2,7-carbazole-alt-5,5-(4'-7'-di-2-thienyl-2',1',3'-benzothiadiazole)] (PCDTBT), poly[2,6-(4,4-bis-(2, ethylhexyl)-4H-cyclopenta[2,1-b;3,4-b']dithiophene)-alt-4,7-(2,1,3-benzothiadiazole)] (PCPDTBT), poly[2,7-(9,9-dioctyl-fluorene)-alt-5,5-(4,7-di 2-thienyl-2,1,3-benzothiadiazole)] (PFO-DBT), poly[[4,8-bis[(2-ethylhexyl)oxy]benzo[1,2-b:4,5-b']dithiophene-2,6-diyl][3-fluoro-2-[(2-ethylhexyl)carbonyl]thieno[3,4-b]thiophenediyl]] (PTB7) and poly[2,7-(9,9-dioctyl-dibenzosilole)-alt-4,7-bis(thiophen-2-yl)benzo-2,1,3-thiadiazole] (PSiF-DBT). In addition, materials described in any one or more of Korean Patent Application Nos. 10-2012-0143044, 10-2014-0184885, 10-2015-0020471 and 10-2015-0173394 or copolymers represented by the following chemical formulae may be included. In the following chemical formulae, n means a repetition number of each unit.

repeating unit = 1887

In one embodiment of the present specification, the electron donor material includes PTB7; a polymer including a first unit represented by the following Chemical Formula 1 and a second unit represented by the following Chemical Formula 2; or a polymer including one, two or more units selected from the group consisting of units represented by the following Chemical Formula 1-1 and units represented by the following Chemical Formula 1-2.

[Chemical Formula 1]

[Chemical Formula 2]

[Chemical Formula 1-1]

[Chemical Formula 1-2]

In Chemical Formulae 1 and 2,

X1 and X2 are the same as or different from each other, and each independently CRR', NR, O, SiRR', PR, S, GeRR', Se or Te, Y1 to Y4 are the same as or different from each other, and each independently CR", N, SiR", P or GeR", X, X', X" and X'" are the same as or different from each other, and each independently S or Se, A1 and A2 are the same as or different from each other, and each independently hydrogen; or fluorine, L1 and L2 are the same as or different from each other, and each independently a direct bond; O; or S, A3 and A4 are the same as or different from each other, and each independently hydrogen; fluorine; a substituted or unsubstituted alkyl group; a substituted or unsubstituted aryl group; or a substituted or unsubstituted heterocyclic group, at least one of L1 and L2 is O or S, R, R', R" and R1 to R8 are the same as or different from each other, and each independently hydrogen; deuterium; a halogen group; a hydroxyl group; a substituted or unsubstituted alkyl group; a substituted or unsubstituted alkoxy group; a substituted or unsubstituted aryl group; or a substituted or unsubstituted heterocyclic group, a1 to a4 are each an integer of 0 or 1, and in Chemical Formulae 1-1 and 1-2, x is, in a mole fraction, 0<x<1, y is, in a mole fraction, 0<y<1, x+y=1, p is, in a mole fraction, 0<p<1, q is, in a mole fraction, 0<q<1, p+q=1, z and r are each an integer of 1 to 10,000, and R11 to R19 are the same as or different from each other, and each independently hydrogen; a substituted or unsubstituted alkyl group; or a substituted or unsubstituted alkoxy group.

In one embodiment of the present specification, R11 is a substituted or unsubstituted alkoxy group.

In another embodiment, R11 is a substituted or unsubstituted octoxy group.

In another embodiment, R11 is an octoxy group.

In one embodiment of the present specification, R12 is a substituted or unsubstituted alkoxy group.

In another embodiment, R12 is a substituted or unsubstituted octoxy group.

In another embodiment, R12 is an octoxy group.

In one embodiment of the present specification, R13 is a substituted or unsubstituted alkyl group.

In another embodiment, R13 is a substituted or unsubstituted dodecanyl group.

In another embodiment, R13 is a dodecanyl group.

In one embodiment of the present specification, R14 is a substituted or unsubstituted alkyl group.

In another embodiment, R14 is a linear or branched alkyl group.

In another embodiment, R14 is a substituted or unsubstituted 2-ethylhexyl group.

In one embodiment of the present specification, R14 is a 2-ethylhexyl group.

In one embodiment of the present specification, R15 is a substituted or unsubstituted alkyl group.

In another embodiment, R15 is a linear or branched alkyl group.

In another embodiment, R15 is a substituted or unsubstituted 2-ethylhexyl group.

In another embodiment, R15 is a 2-ethylhexyl group.

In one embodiment of the present specification, R16 is a substituted or unsubstituted alkyl group.

In another embodiment, R16 is a substituted or unsubstituted dodecanyl group.

In another embodiment, R16 is a dodecanyl group.

In one embodiment of the present specification, R17 is hydrogen.

In one embodiment of the present specification, R18 is hydrogen.

In one embodiment of the present specification, R19 is a substituted or unsubstituted alkyl group.

In another embodiment, R19 is a substituted or unsubstituted dodecanyl group.

In another embodiment, R19 is a dodecanyl group.

In one embodiment of the present specification, the unit represented by Chemical Formula 1-1 is represented by the following Chemical Formula 1-11.

[Chemical Formula 1-11]

In Chemical Formula 1-11, z is the same as described above.

In one embodiment of the present specification, the unit represented by Chemical Formula 1-2 is represented by the following Chemical Formula 1-22.

[Chemical Formula 1-22]

In Chemical Formula 1-22, r is the same as described above.

In one embodiment of the present specification, a terminal group of the polymer is a substituted or unsubstituted heterocyclic group or a substituted or unsubstituted aryl group.

In one embodiment of the present specification, a terminal group of the polymer is a 4-(trifluoromethyl)phenyl group.

In one embodiment of the present specification, X1 is S.

In one embodiment of the present specification, Y1 is N.

In one embodiment of the present specification, Y2 is N.

In one embodiment of the present specification, a1 is 1.

In one embodiment of the present specification, a2 is 1.

In one embodiment of the present specification, R2 is hydrogen.

In one embodiment of the present specification, R3 is hydrogen.

In one embodiment of the present specification, the polymer including the first unit represented by Chemical Formula 1; and the second unit represented by Chemical Formula 2 is represented by the following Chemical Formula 3.

[Chemical Formula 3]

In Chemical Formula 3, A3, A4, R1 and R4 are the same as described above, l is, in a mole fraction, $0<l<1$, m is, in a mole fraction, $0<m<1$, $l+m=1$, and n is a repetition number of units and is an integer of 1 to 10,000.

In one embodiment of the present specification, A3 and A4 are the same as or different from each other, and each independently a substituted or unsubstituted alkyl group.

In another embodiment, A3 and A4 are the same as or different from each other, and each independently a substituted or unsubstituted alkyl group having 1 to 30 carbon atoms.

In another embodiment, A3 and A4 are a substituted or unsubstituted dodecyl group.

In one embodiment of the present specification, A3 is a dodecyl group.

In one embodiment of the present specification, A4 is a dodecyl group.

In one embodiment of the present specification, R1 and R4 are the same as or different from each other, and each independently a substituted or unsubstituted alkyl group.

In another embodiment, R1 and R4 are the same as or different from each other, and each independently a substituted or unsubstituted alkyl group having 1 to 30 carbon atoms.

In another embodiment, R1 and R4 are the same as or different from each other, and each independently a substituted or unsubstituted linear or branched alkyl group having 1 to 30 carbon atoms.

In another embodiment, R1 and R4 are the same as or different from each other, and each independently a substituted or unsubstituted 2-ethylhexyl group.

In another embodiment, R1 and R4 are the same as or different from each other, and each independently a substituted or unsubstituted 2-octyldecyl group.

In another embodiment, R1 is a 2-ethylhexyl group.
In another embodiment, R4 is a 2-ethylhexyl group.
In another embodiment, R1 is a 2-ethyloctyl group.
In another embodiment, R4 is a 2-ethyloctyl group.
In another embodiment, R1 is a 2-ethyldecyl group.
In another embodiment, R4 is a 2-ethyldecyl group.
In another embodiment, R1 is a 2-ethyldodecyl group.
In another embodiment, R4 is a 2-ethyldodecyl group.
In another embodiment, R1 is a 2-butyloctyl group.
In another embodiment, R4 is a 2-butyloctyl group.
In another embodiment, R1 is a 2-octyldecyl group.
In another embodiment, R4 is a 2-octyldecyl group.

In one embodiment of the present specification, a terminal group of the polymer is a substituted or unsubstituted heterocyclic group or a substituted or unsubstituted aryl group.

In another embodiment, the polymer includes a unit represented by the following Chemical Formula 4.

[Chemical Formula 4]

In Chemical Formula 4,
l is, in a mole fraction, $0<l<1$,
m is, in a mole fraction, $0<m<1$,
$l+m=1$,
n is a repetition number of units and is an integer of 1 to 10,000.

In one embodiment of the present specification, l is 0.5.
In one embodiment of the present specification, m is 0.5.
In one embodiment of the present specification, the electron acceptor material may be a fullerene derivative or a non-fullerene derivative.

In one embodiment of the present specification, the fullerene derivative may be a C60 to C90 fullerene derivative. Specifically, the fullerene derivative may be a C60 fullerene derivative or a C70 fullerene derivative.

The fullerene derivative may be unsubstituted or substituted with additional substituents.

The fullerene derivative has superior ability separating an electron-hole pair (exciton) and superior charge mobility compared to non-fullerene derivatives, which is advantageous in efficiency properties.

In one embodiment of the present specification, the organic electronic device further includes one, two or more organic material layers selected from the group consisting of a hole injection layer, a hole transfer layer, a hole blocking layer, a charge generation layer, an electron blocking layer, an electron injection layer and an electron transfer layer.

In the present specification, the hole transfer layer and/or the electron transfer layer materials perform a role of efficiently transferring electrons and holes separated in an organic active layer to electrodes, and the materials are not particularly limited.

In the present specification, the hole transfer layer material may include poly(3,4-ethylenedioxythiophene) doped with poly(styrenesulfonate) (PEDOT:PSS), molybdenum oxide ($MoO_x$); vanadium oxide ($V_2O_5$); nickel oxide (NiO); tungsten oxide ($WO_x$) and the like, but is not limited thereto.

One embodiment of the present specification provides a method for manufacturing an organic electronic device including preparing a substrate; forming a cathode on the substrate; forming an electron transfer layer on the cathode; forming an organic active layer on the electron transfer layer; and forming an anode on the organic active layer, wherein the electron transfer layer includes an oxidized non-conjugated polymer electrolyte.

One embodiment of the present specification provides a method for manufacturing an organic electronic device including preparing a substrate; forming a cathode on the substrate; forming an electron transfer layer on the cathode; forming a coating layer on the electron transfer layer; forming an organic active layer on the coating layer; and forming an anode on the organic active layer, wherein the coating layer includes an oxidized non-conjugated polymer electrolyte.

In the present specification, the substrate, the cathode, the electron transfer layer, the oxidized non-conjugated polymer electrolyte, the organic active layer and the anode are the same as described above.

In one embodiment of the present specification, the forming of an electron transfer layer or a coating layer including an oxidized non-conjugated polymer electrolyte includes oxidizing a non-conjugated polymer electrolyte using a peroxide-based oxidizer; and forming an organic material layer including the oxidized non-conjugated polymer electrolyte.

In addition, in one embodiment of the present specification, the forming of an electron transfer layer or a coating layer including an oxidized non-conjugated polymer electrolyte includes oxidizing a non-conjugated polymer electrolyte using hydrogen peroxide; and forming an organic material layer including the oxidized non-conjugated polymer electrolyte.

When oxidizing the non-conjugated polymer electrolyte using hydrogen peroxide in the present specification, water remains as a solvent of the non-conjugated polymer electrolyte.

In one embodiment of the present specification, a step of laminating one, two or more organic material layers selected from the group consisting of a hole injection layer, a hole transfer layer, a hole blocking layer, a charge generation layer, an electron blocking layer, an electron injection layer and an electron transfer layer may be further included between each of the steps.

The organic electronic device according to one embodiment of the present specification may use methods known in the art except for including an electron transfer layer or a coating layer including an oxidized non-conjugated polymer electrolyte.

In one embodiment of the present specification, in the forming of an anode and/or a cathode, a patterned ITO substrate is washed consecutively with a detergent, acetone and isopropanol (IPA), and then dried for 1 minute to 30 minutes at 100° C. to 250° C., specifically, for 10 minutes at 250° C. on a hot plate for removing moisture, and when the substrate is completely cleaned, the substrate surface may be modified to be hydrophilic. A pretreatment technology for this may include a) a surface oxidation method using parallel plate-type discharge, b) a method of oxidizing a surface through ozone generated using ultraviolet (UV) light under vacuum and c) an oxidation method using oxygen radicals produced by plasma, and the like. Through such surface modification, junction surface potential may be maintained at a level suited for surface potential of a hole injection layer, a polymer thin film may be readily formed on the ITO substrate, and qualities of the thin film may be enhanced. One of the above-mentioned methods is selected depending on the condition of the substrate, however, regardless of the method used, oxygen breakaway on the substrate surface needs to be prevented and remaining of moisture and organic matters needs to be suppressed as much as possible in order to expect practical pretreatment effects.

In the examples of the present specification described below, the method of oxidizing a surface through ozone produced using UV is used, and after ultrasonic cleaning, a patterned ITO substrate is well dried through baking on a hot plate, then introduced to a chamber, and the patterned ITO substrate is cleaned using ozone generated from a reaction of oxygen gas and UV light by working a UV lamp. However, the surface modification method of the patterned ITO substrate in the present disclosure is not particularly limited, and any method may be used as long as it is a method oxidizing a substrate.

The electron transfer layer of the present specification may be formed by being coated on one surface of a cathode or coated in a film form thereon using sputtering, E-Beam, thermal deposition, spin coating, screen printing, inkjet printing, doctor blade, slot-die or a gravure printing method.

In addition, the photoactive layer in the present specification may be formed by dissolving the photoactive materials described above in an organic solvent and then forming the solution to a thickness in a 50 nm to 280 nm range using a method of spin coating and the like. Herein, the photoactive layer may use methods such as dip coating, screen printing, spray coating, doctor blade or brush painting.

Hereinafter, the present specification will be described in detail with reference to examples in order to specifically describe the present specification. However, examples according to the present specification may be modified to various different forms, and the scope of the present specification is not construed as being limited to the examples described below. Examples of the present specification are provided in order to more fully describe the present specification to those having average knowledge in the art.

Example 1

ITO was formed on a substrate as a first electrode, and an electron transfer layer was formed on the ITO by spin-coating ZnO. An oxidized non-conjugated polymer electrolyte layer (2 nm to 15 nm) was formed on the electron transfer layer as a coating layer by spin-coating polyethyleneimine (PEI) oxidized with hydrogen peroxide. A photoactive layer was formed on the oxidized non-conjugated polymer electrolyte layer by spin-coating $PC_{71}BM$ and a copolymer represented by the following chemical formula, and a hole transfer layer was formed on the photoactive layer. The hole transfer layer was formed on the photoactive layer using a method of depositing $MoO_3$ (8 nm to 20 nm), and lastly, a second electrode was formed on the hole transfer layer using a method of depositing Ag (100 nm to 200 nm).

Example 2

An organic solar cell was manufactured in the same manner as in Example 1 except that PC$_{61}$BM and a copolymer represented by the following chemical formula were used when forming the photoactive layer.

Example 3

An organic solar cell was manufactured in the same manner as in Example 1 except that PC$_{71}$BM and PTB7 represented by the following chemical formula (purchased from 1-material) were used when forming the photoactive layer.

Example 4

An organic solar cell was manufactured in the same manner as in Example 1 except that the ZnO layer was not formed on the ITO layer.

Example 5

An organic solar cell was manufactured in the same manner as in Example 2 except that the ZnO layer was not formed on the ITO layer.

Example 6

ITO was formed on a substrate as a first electrode, and an electron transfer layer was formed on the ITO by spin-coating polyethyleneimine (PEI) oxidized with hydrogen peroxide. A photoactive layer was formed on the electron transfer layer by spin-coating PC$_{61}$BM and a copolymer represented by the following chemical formula, and a hole transfer layer was formed on the photoactive layer. The hole transfer layer was formed on the photoactive layer using a method of depositing MoO$_3$ (8 nm to 20 nm), and lastly, a second electrode was formed on the hole transfer layer using a method of depositing Ag (100 nm to 200 nm).

P3HT

Example 7

An organic solar cell was manufactured in the same manner as in Example 6 except that PC$_{61}$BM and a copolymer represented by the following chemical formula were used when forming the photoactive layer.

Comparative Example 1

An organic solar cell was manufactured in the same manner as in Example 1 except that the non-conjugated polymer electrolyte layer was not formed.

Comparative Example 2

An organic solar cell was manufactured in the same manner as in Example 1 except that polyethyleneimine (PEI) was used instead of the oxidized polyethyleneimine.

Comparative Example 3

An organic solar cell was manufactured in the same manner as in Example 2 except that a separate oxidized non-conjugated polymer electrolyte layer was not formed on the ZnO.

Comparative Example 4

An organic solar cell was manufactured in the same manner as in Example 3 except that a separate non-conjugated polymer electrolyte layer was not formed on the ZnO.

Comparative Example 5

An organic solar cell was manufactured in the same manner as in Example 3 except that the electron transfer layer was not formed using ZnO on the ITO.

Comparative Example 6

An organic solar cell was manufactured in the same manner as in Example 6 except that polyethyleneimine (PEI) was used instead of the oxidized polyethyleneimine.

Comparative Example 7

An organic solar cell was manufactured in the same manner as in Example 7 except that polyethyleneimine (PEI) was used instead of the oxidized polyethyleneimine.

Comparative Example 8

An organic solar cell was manufactured in the same manner as in Example 5 except that polyethyleneimine (PEI) was used instead of the oxidized polyethyleneimine.

Comparative Example 9

An organic solar cell was manufactured in the same manner as in Example 1 except that poly[(9,9-bis(3'-(N,N-dimethylamino)propyl)-2,7-fluorene)-alt-2,7-(9,9-dioctyl-fluorene)] (PFN), a conjugated polymer electrolyte, of the following chemical formula oxidized with hydrogen peroxide was used instead of the oxidized polyethyleneimine.

Comparative Example 10

An organic solar cell was manufactured in the same manner as in Example 4 except that poly[(9,9-bis(3'-(N,N-dimethylamino)propyl)-2,7-fluorene)-alt-2,7-(9,9-dioctyl-fluorene)] (PFN), a conjugated polymer electrolyte, oxidized with hydrogen peroxide was used instead of the oxidized polyethyleneimine.

Experimental Example 1

Photoelectric conversion characteristics of the organic solar cells manufactured in Examples 1 to 7 and Comparative Examples 1 to 10 were measured under a 100 mW/cm$^2$ (AM 1.5) condition, and the results are shown in the following Table 1.

TABLE 1

| | $V_{oc}$ (V) | $J_{sc}$ (mA/cm$^2$) | FF | $\eta$ (%) | Average $\eta$ (%) |
|---|---|---|---|---|---|
| Example 1 | 0.759 | 16.441 | 0.691 | 8.62 | 8.59 |
| | 0.758 | 16.184 | 0.699 | 8.57 | |
| | 0.758 | 16.098 | 0.702 | 8.57 | |
| Example 2 | 0.949 | 13.100 | 0.638 | 7.93 | 8.14 |
| | 0.941 | 13.373 | 0.649 | 8.17 | |
| | 0.945 | 13.321 | 0.660 | 8.31 | |
| Example 3 | 0.685 | 16.322 | 0.654 | 7.32 | 7.32 |
| | 0.684 | 16.335 | 0.656 | 7.33 | |
| | 0.688 | 16.156 | 0.658 | 7.32 | |
| Example 4 | 0.752 | 16.386 | 0.631 | 7.77 | 7.82 |
| | 0.750 | 16.398 | 0.650 | 8.00 | |
| | 0.748 | 16.217 | 0.633 | 7.68 | |
| Example 5 | 0.943 | 13.222 | 0.633 | 7.90 | 7.88 |
| | 0.943 | 13.313 | 0.620 | 7.78 | |
| | 0.938 | 13.333 | 0.636 | 7.95 | |
| Example 6 | 0.650 | 8.795 | 0.728 | 4.16 | 4.13 |
| | 0.645 | 8.808 | 0.722 | 4.10 | |
| Example 7 | 0.867 | 13.330 | 0.651 | 7.53 | 7.50 |
| | 0.863 | 13.204 | 0.655 | 7.47 | |
| Comparative Example 1 | 0.754 | 15.355 | 0.677 | 7.84 | 7.80 |
| | 0.76 | 14.920 | 0.692 | 7.85 | |
| | 0.753 | 14.617 | 0.701 | 7.72 | |
| Comparative Example 2 | 0.7794 | 14.292 | 0.650 | 7.24 | 7.24 |
| | 0.7772 | 14.549 | 0.641 | 7.25 | |
| | 0.7754 | 14.549 | 0.640 | 7.22 | |
| Comparative Example 3 | 0.930 | 13.033 | 0.538 | 6.52 | 7.04 |
| | 0.927 | 13.737 | 0.572 | 7.28 | |
| | 0.928 | 13.691 | 0.576 | 7.32 | |
| Comparative Example 4 | 0.688 | 15.865 | 0.619 | 6.76 | 6.74 |
| | 0.687 | 15.751 | 0.617 | 6.68 | |
| | 0.691 | 15.694 | 0.626 | 6.78 | |
| Comparative Example 5 | 0.669 | 15.338 | 0.614 | 6.29 | 6.10 |
| | 0.667 | 15.219 | 0.592 | 6.00 | |
| | 0.668 | 15.065 | 0.598 | 6.02 | |
| Comparative Example 6 | 0.641 | 8.747 | 0.689 | 3.86 | 3.92 |
| | 0.640 | 8.774 | 0.709 | 3.98 | |

TABLE 1-continued

| | $V_{oc}$ (V) | $J_{sc}$ (mA/cm$^2$) | FF | η (%) | Average η (%) |
|---|---|---|---|---|---|
| Comparative Example 7 | 0.883 | 11.791 | 0.582 | 6.16 | 6.17 |
| | 0.879 | 12.024 | 0.585 | 6.18 | |
| Comparative Example 8 | 0.948 | 12.664 | 0.544 | 6.53 | 6.54 |
| | 0.953 | 13.396 | 0.513 | 6.55 | |
| Comparative Example 9 | 0.733 | 16.782 | 0.471 | 5.80 | 5.82 |
| | 0.735 | 16.236 | 0.491 | 5.86 | |
| | 0.735 | 16.437 | 0.480 | 5.80 | |
| Comparative Example 10 | 0.673 | 15.985 | 0.318 | 3.42 | 3.65 |
| | 0.557 | 15.872 | 0.438 | 3.87 | |
| | 0.677 | 16.184 | 0.335 | 3.67 | |

In Table 1, $V_{oc}$ means an open voltage, $J_{sc}$ means a short-circuit current, FF means a fill factor, and η means power conversion efficiency (PCE). The open voltage and the short-circuit current are each an x-axis and a y-axis intercept in the four quadrants of a voltage-current density curve, and as these two values increase, solar cell efficiency is preferably enhanced. In addition, the fill factor is a value dividing the rectangle area that may be drawn inside the curve by the product of the short-circuit current and the open voltage. The power conversion efficiency may be obtained when these three values are divided by intensity of the irradiated light, and it is preferred as the value is higher.

In Table 1, when comparing the cases where only the formation of the oxidized non-conjugated polymer electrolyte layer differed under the same condition, it was identified that Example 1 exhibited excellent efficiency compared to Comparative Example 1, Example 2 exhibited excellent efficiency compared to Comparative Example 3, and Example 3 exhibited excellent efficiency compared to Comparative Example 4.

In addition, when comparing the cases where only the oxidation of the non-conjugated polymer electrolyte differed, Example 1 exhibited more superior efficiency compared to Comparative Example 2, Example 6 exhibited more superior efficiency compared to Comparative Example 6, Example 7 exhibited more superior efficiency compared to Comparative Example 7, and Example 5 exhibited more superior efficiency compared to Comparative Example 8.

Furthermore, through the power conversion efficiency (η) comparison between Examples 1 and 4 using an oxidized non-conjugated polymer electrolyte and Comparative Examples 9 and 10 using an oxidized conjugated polymer electrolyte, it was identified that far more superior efficiency was obtained when using the oxidized non-conjugated polymer electrolyte compared to the oxidized conjugated polymer electrolyte.

Experimental Example 2

Figure 4:
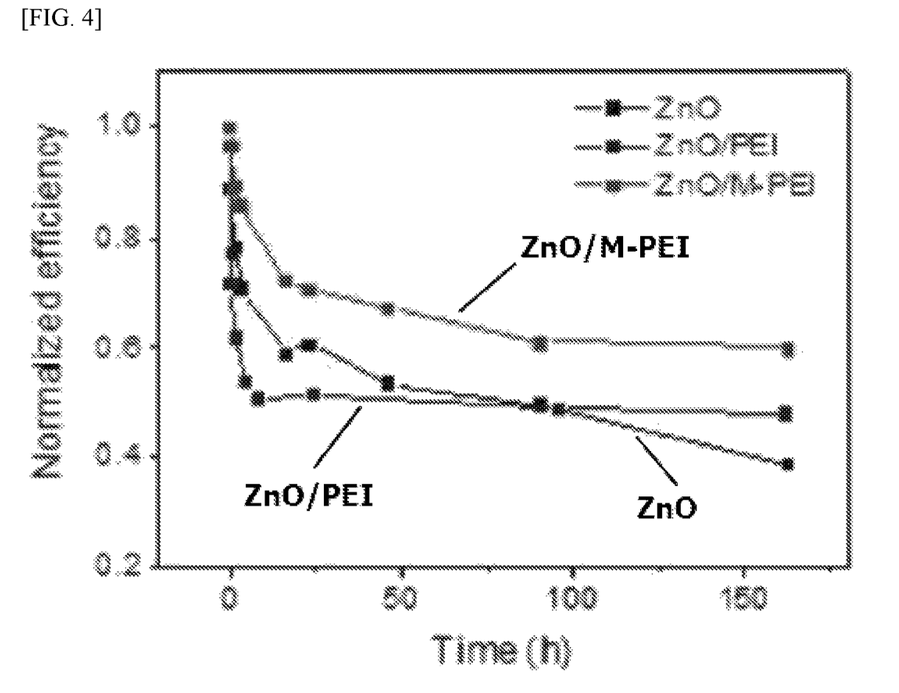
FIG. 4 shows lifespans of organic solar cells according to one embodiment.
Figure 5:
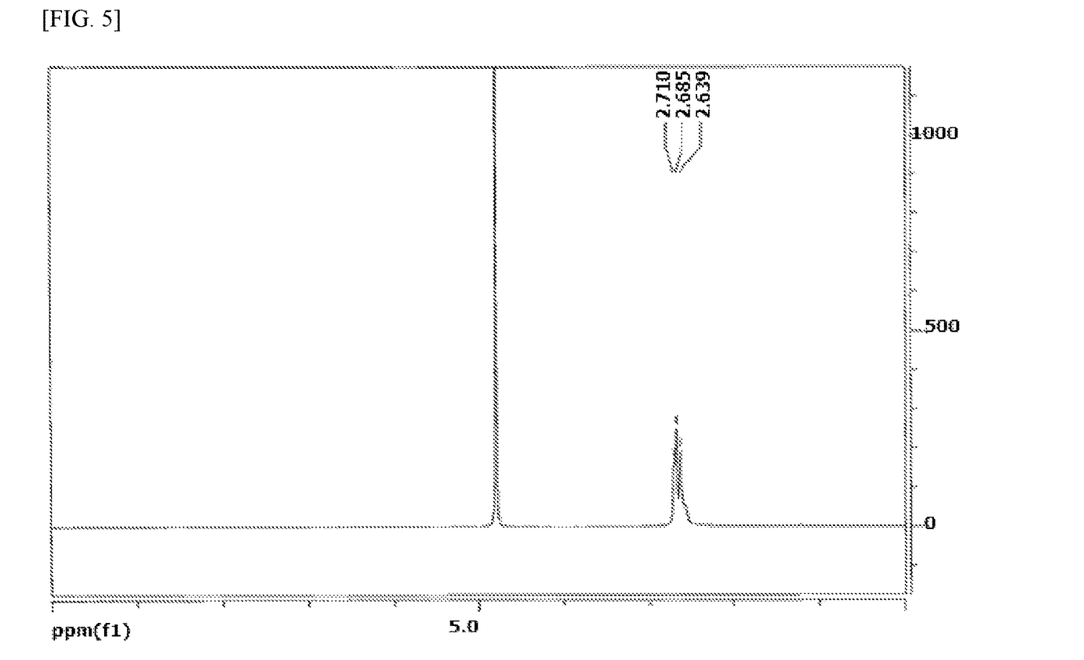
FIG. 5 is a graph showing an NMR analysis result of polyethyleneimine (PEI).
Figure 6:
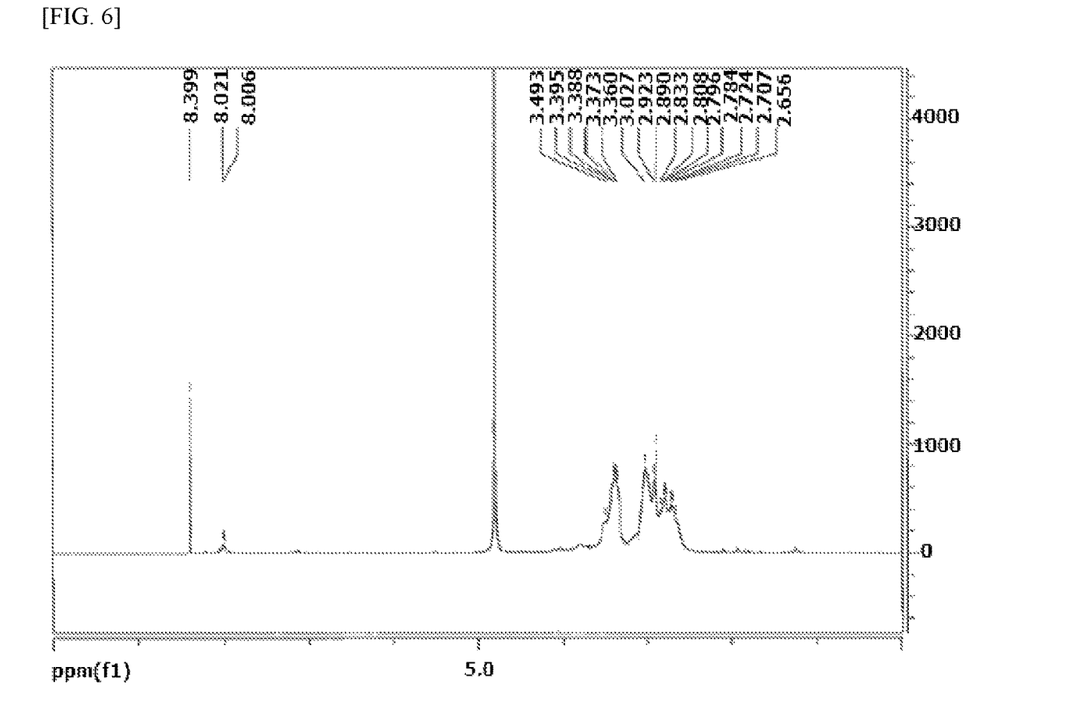
FIG. 6 is a graph showing an NMR analysis result of oxidized polyethyleneimine (M-PEI).

Efficiency by time (1 SUN condition) of the organic solar cells manufactured in Example 1, Comparative Example 1 and Comparative Example 2 was measured, and the results are shown in FIG. 4. Based on the results of FIG. 4, it was identified that the organic solar cell including an oxidized non-conjugated polymer electrolyte layer had an excellent lifespan with a small efficiency drop over time compared to the organic solar cell including a non-oxidized non-conjugated polymer electrolyte layer.

What is claimed is:
1. An organic electronic device comprising:
a cathode;
an anode on the cathode;
an organic active layer between the cathode and the anode; and
an electron transfer layer between the cathode and the organic active layer,
wherein the electron transfer layer comprises an oxidized non-conjugated polymer electrolyte.

2. The organic electronic device of claim 1, wherein the oxidized non-conjugated polymer electrolyte comprises at least one of —NR$_2$$^+$O$^-$ and —COOH$^+$O$^-$, and R is hydrogen, or a monovalent organic group.

3. The organic electronic device of claim 1, wherein the oxidized non-conjugated polymer electrolyte comprises at least one of hydroxylamine, nitrone, oxazirane and N-oxide.

4. The organic electronic device of claim 1, wherein the oxidized non-conjugated polymer electrolyte comprises one, two or more selected from the group consisting of polyethyleneimine (PEI), polyethyleneimine ethoxylate (PETE), and polyacrylic acid (PAA).

5. The organic electronic device of claim 1, wherein the organic electronic device has an inverted structure.

6. The organic electronic device of claim 1, wherein the electron transfer layer is adjoining the organic active layer.

7. The organic electronic device of claim 1, wherein the organic active layer comprises an electron donor material and an electron acceptor material.

8. The organic electronic device of claim 7, wherein the electron acceptor material comprises a fullerene derivative.

9. The organic electronic device of claim 7, wherein the electron donor material is poly[[4,8-bis[(2-ethylhexyl)oxy]benzo[1,2-b:4,5-b']dithiophene-2,6-diyl] [3-fluoro-2-[(2-ethylhexyl)carbonyl]thieno[3,4-b]thiophenediyl]] (PTB7), a polymer including a first unit of Chemical Formula 1 and a second unit of Chemical Formula 2, or a polymer including one, two or more units selected from the group consisting of a unit of Chemical Formula 1-1 and a unit of Chemical Formula 1-2:

[Chemical Formula 1]

[Chemical Formula 2]

-continued

[Chemical Formula 1-1]

[Chemical Formula 1-2]

Wherein:
X1 and X2 are the same as or different from each other, and each is independently CRR', NR, O, SiRR', PR, S, GeRR', Se or Te;
Y1 to Y4 are the same as or different from each other, and each is independently CR'', N, SiR'', P or GeR'';
X, X', X'' and X''' are the same as or different from each other, and each is independently S or Se;
A1 and A2 are the same as or different from each other, and each is independently hydrogen, or fluorine;
L1 and L2 are the same as or different from each other, and each is independently a direct bond, O, or S;
A3 and A4 are the same as or different from each other, and each is independently hydrogen, fluorine, a substituted or unsubstituted alkyl group, a substituted or unsubstituted aryl group, or a substituted or unsubstituted heterocyclic group;
at least one of L1 and L2 is O or S;
R, R', R'' and R1 to R8 are the same as or different from each other, and each is independently hydrogen, deuterium, a halogen group, a hydroxyl group, a substituted or unsubstituted alkyl group, a substituted or unsubstituted alkoxy group, a substituted or unsubstituted aryl group, or a substituted or unsubstituted heterocyclic group;
a1 to a4 are each an integer of 0 or 1;
x is a mole fraction (0<x<1);
y is a mole fraction (0<y<1);
x+y=1;
p is a mole fraction (0<p<1);
q is a mole fraction (0<q<1);
p+q=1;
z and r are each an integer of 1 to 10,000; and
R11 to R19 are the same as or different from each other, and each is independently hydrogen, a substituted or unsubstituted alkyl group, or a substituted or unsubstituted alkoxy group.

10. The organic electronic device of claim 1, further comprising one, two or more organic material layers selected from the group consisting of a hole injection layer, a hole transfer layer, a hole blocking layer, a charge generation layer, an electron blocking layer and an electron injection layer.

11. A method of manufacturing an organic electronic device comprising:
providing a substrate;
forming a cathode on the substrate;
forming an electron transfer layer on the cathode;
forming an organic active layer on the electron transfer layer; and
forming an anode on the organic active layer,
wherein the electron transfer layer comprises an oxidized non-conjugated polymer electrolyte.

12. The method of claim 11, wherein forming the electron transfer layer on the cathode comprises:
oxidizing a non-conjugated polymer electrolyte using a peroxide-based oxidizer to form the oxidized non-conjugated polymer electrolyte; and
forming the electron transfer layer including the oxidized non-conjugated polymer electrolyte.

13. A method of manufacturing an organic electronic device comprising:
providing a substrate;
forming a cathode on the substrate;
forming an electron transfer layer on the cathode;
forming a coating layer on the electron transfer layer;
forming an organic active layer on the coating layer; and
forming an anode on the organic active layer,
wherein the coating layer comprises an oxidized non-conjugated polymer electrolyte.

14. The method of claim 13, wherein forming the coating layer on the electron transfer layer comprises;
oxidizing a non-conjugated polymer electrolyte using a peroxide-based oxidizer to form the oxidized non-conjugated polymer electrolyte; and
forming the coating layer including the oxidized non-conjugated polymer electrolyte.

15. An organic electronic device comprising:
a cathode;
an anode on the cathode;
an organic active layer between the cathode and the anode;
an electron transfer layer between the cathode and the organic active layer; and
a coating layer between the organic active layer and the electron transfer layer,
wherein the coating layer comprises an oxidized non-conjugated polymer electrolyte.

16. The organic electronic device of claim 15, wherein the oxidized non-conjugated polymer electrolyte comprises at least one of $—NR_2^+O^-$ and $—COOH^+O^-$, and R is hydrogen, or a monovalent organic group.

17. The organic electronic device of claim 15, wherein the oxidized non-conjugated polymer electrolyte comprises at least one of hydroxylamine, nitrone, oxazirane and N-oxide.

18. The organic electronic device of claim 15, wherein the oxidized non-conjugated polymer electrolyte comprises one, two or more selected from the group consisting of polyethyleneimine (PEI), polyethyleneimine ethoxylate (PETE), and polyacrylic acid (PAA).

19. The organic electronic device of claim 15, wherein the coating layer is disposed adjoining the organic active layer.

20. The organic electronic device of claim 15, wherein the organic active layer comprises an electron donor material and an electron acceptor material.

* * * * *

UNITED STATES PATENT AND TRADEMARK OFFICE
CERTIFICATE OF CORRECTION

PATENT NO. : 10,662,313 B2
APPLICATION NO. : 16/304004
DATED : May 26, 2020
INVENTOR(S) : Choi et al.

Page 1 of 1

It is certified that error appears in the above-identified patent and that said Letters Patent is hereby corrected as shown below:

In the Claims

Column 22, Line 19, Claim 4: Please correct "(PETE)" to read -- (PEIE) --

Column 24, Line 58, Claim 18: Please correct "(PETE)" to read -- (PEIE) --

Signed and Sealed this
Tenth Day of November, 2020

Andrei Iancu
*Director of the United States Patent and Trademark Office*